US008904616B2

(12) United States Patent
Ayabakan et al.

(10) Patent No.: US 8,904,616 B2
(45) Date of Patent: Dec. 9, 2014

(54) METHOD OF MONITORING A CRIMPING PROCESS, CRIMPING PRESS AND COMPUTER PROGRAM PRODUCT

(75) Inventors: Mustafa Ayabakan, Wuppertal (DE); Witali Janzen, Wuppertal (DE)

(73) Assignee: Schleuniger Holding AG, Thun (CH)

( * ) Notice: Subject to any disclaimer, the term of this patent is extended or adjusted under 35 U.S.C. 154(b) by 577 days.

(21) Appl. No.: 13/346,723

(22) Filed: Jan. 9, 2012

(65) Prior Publication Data

US 2012/0103043 A1 May 3, 2012

Related U.S. Application Data

(63) Continuation-in-part of application No. 13/255,029, filed as application No. PCT/IB2010/051530 on Apr. 8, 2010, now Pat. No. 8,671,538.

(60) Provisional application No. 61/168,212, filed on Apr. 9, 2009.

(30) Foreign Application Priority Data

Apr. 9, 2009 (CH) ...................................... 0580/09

(51) Int. Cl.
*B23Q 17/00* (2006.01)
*G01R 31/28* (2006.01)
*H01R 43/048* (2006.01)

(52) U.S. Cl.
CPC ........... *H01R 43/0486* (2013.01); *Y10S 72/712* (2013.01)
USPC ...... 29/407.08; 29/593; 29/407.09; 29/407.1; 29/407.01; 29/705; 29/753; 29/715; 72/21.4; 72/712

(58) Field of Classification Search
USPC ............... 29/407.01, 407.05, 407.08, 407.09, 29/407.1, 593, 705, 709, 715, 753; 72/21.4, 20.1, 20.2, 712
See application file for complete search history.

(56) References Cited

U.S. PATENT DOCUMENTS 4,812,138 A 3/1989 Kondo et al.
4,914,602 A 4/1990 Abe et al.
(Continued)

FOREIGN PATENT DOCUMENTS

DE 4337796 A1 5/1995
EP 0460441 B1 12/1991
(Continued)

OTHER PUBLICATIONS

Examiner's Reasons for Allowance dated Oct. 28, 2013 from parent U.S. Appl. No. 13/255,029, filed Sep. 23, 2011 (371 national date).

(Continued)

*Primary Examiner* — Essama Omgba
(74) *Attorney, Agent, or Firm* — George Kapsalas; Patentbuero Paul Rosenich AG

(57) ABSTRACT

A method of monitoring a crimping process is disclosed, which determines whether an actual force stroke progression (Fa)/force-time progression is, a) above, or, b) below an ideal force stroke progression (Fi)/force-time progression in at least one point. The method shifts an upper border (Bu) and/or the lower border (Bl) of a tolerance band upwards in case a) and downwards in case b), utilizing four zones (Z1-Z4) of determined force progression. Additionally, there are is an absolute upper limit (Lu), at which an upward shifting of the upper border (Bu) is inhibited, and an absolute lower limit (Ll), at which a downward shifting of the lower border (Bl) is inhibited. Moreover, a crimping press and a computer program product embodying the method are disclosed.

23 Claims, 5 Drawing Sheets

(56) References Cited

U.S. PATENT DOCUMENTS

| | | | |
|---|---|---|---|
| 5,092,026 | A | 3/1992 | Klemmer et al. |
| 5,123,165 | A | 6/1992 | Strong et al. |
| 5,197,186 | A | 3/1993 | Strong et al. |
| 5,271,254 | A | 12/1993 | Gloe et al. |
| 5,727,409 | A | 3/1998 | Inoue et al. |
| 5,841,675 | A | 11/1998 | Ngo |
| 5,921,125 | A | 7/1999 | Inoue et al. |
| 5,937,505 | A | 8/1999 | Strong et al. |
| 6,161,407 | A | 12/2000 | Meisser |
| 6,212,924 | B1 | 4/2001 | Meisser |
| 6,418,769 | B1 | 7/2002 | Schreiner |
| 6,819,116 | B2 | 11/2004 | Ishibashi et al. |
| 8,336,351 | B2 | 12/2012 | Handel et al. |
| 8,671,538 | B2 | 3/2014 | Ayabakan et al. |
| 2010/0139351 | A1 | 6/2010 | Bruhin |
| 2012/0137486 | A1 | 6/2012 | Charlton et al. |

FOREIGN PATENT DOCUMENTS

| | | | |
|---|---|---|---|
| EP | 0730326 | A2 | 9/1996 |
| EP | 1243932 | A2 | 9/2002 |
| EP | 1291984 | A1 | 3/2003 |
| EP | 1243932 | B9 | 3/2009 |
| JP | H07-111180 | A | 4/1995 |
| JP | H08-330048 | A | 12/1996 |
| WO | 2010/116339 | A1 | 10/2010 |

OTHER PUBLICATIONS

ISR of Swiss(CH) Patent Office in Priority Application No. CH0580/2009, dated Aug. 14, 2009.

PCT International Search Report and Written Opinion from WO2010/116339A1 parent PCT application; mailed Jun. 28, 2010 by WIPO. (English in body of written opinion).

Copending parent U.S. Appl. No. 13/255,029, filed Sep. 23, 2011 (371 national date).

METHOD OF MONITORING A CRIMPING PROCESS, CRIMPING PRESS AND COMPUTER PROGRAM PRODUCT

This application is a Continuation-in-Part (CIP) of U.S. application Ser. No. 13/255,029 filed on Sep. 23, 2011, issued as U.S. Pat. No. 8,671,538 on Mar. 18, 2014, as a section 371 national-phase entry of PCT International application no. PCT/IB2010/051530 filed on Apr. 8, 2010 and published as WO2010/116339A1 on Oct. 14, 2010, which claimed benefit of priority to Swiss application no. 0580/09 filed on Apr. 9, 2009, and claimed benefit as a non-provisional of prior U.S. provisional application No. 61/168,212 filed on Apr. 9, 2009, these claims of benefit of priority being likewise applicable and stated in the present CIP application; the entireties of parent U.S. application Ser. No. 13/255,029, of parent PCT International application no. PCT/IB2010/051530, of Swiss application no. 0580/09 and of prior U.S. provisional application No. 61/168,212 are all expressly incorporated herein by reference in their entireties, for all intents and purposes, as if identically set forth herein.

TECHNICAL FIELD

The invention relates to a method of monitoring a crimping process, comprising the steps of determination whether an actual force stroke progression/force time progression occurring during crimping is within a tolerance band in at least one point, the tolerance band having an upper border above and a lower border below an ideal force stroke progression/force time progression and qualifying a crimp as passed, for which said condition is true. Furthermore, the invention relates to a crimping press for employing the inventive method, comprising apparatus and procedures for determination of whether an actual force-stroke progression/force-time progression occurring during crimping is within a tolerance band in at least one point, the tolerance band having an upper border above and a lower border below an ideal force-stroke progression/force-time progression and apparatus and procedures for qualifying a crimp as passed, for when said condition is true. Finally, the invention relates to a computer program product, which when loaded into the memory of a control for a crimping press performs the functions of the crimping method.

BACKGROUND OF THE INVENTION

Crimping, which is a special kind of beading, is a method for joining parts, in particular a wire with a connector (often having the shape of a plug), by plastic deformation. The resulting permanent joint provides good electrical and mechanical stability and is thus a suitable alternative to other connecting methods such as welding or soldering. Hence, common fields of application for crimping are electric devices (e.g. for telecommunication, electrical equipment for vehicles, etc.). The shape of a crimp should be exactly adapted to the wire so as to provide for a predetermined deformation of the same. Crimping usually is done by a crimping gripper or a crimping press.

According to prior art, the force acting during the crimping process can be measured to monitor and/or ensure a constant quality of crimp connections manufactured by a crimping press. For example, pressure sensors are utilized for this reason, which measure the force between the frame and the die (14) and/or the drive and the plunger (15) (see FIG. 5). A further possibility is to evaluate the deformation of the frame of a crimping press.

For example, U.S. Pat. No. 5,841,675 A discloses a method of monitoring the quality of crimping process. To ensure a particular quality, the peak factor, which is defined as crimp work divided by peak force, is determined. The method includes setting the boundaries based upon the mean and standard deviation of a number of learned samples.

Furthermore, U.S. Pat. No. 6,418,769 B1 discloses a method of monitoring a crimping process, wherein a force stroke progression occurring during crimping is measured and compared to a nominal force stroke progression. The evaluation is done above a particular threshold value.

In addition, EP 1 243 932 A2 discloses a method of monitoring a crimping process, wherein a force time progression occurring during crimping is measured, the crimping work is calculated, said progression is separated in segments and the actual work of a segment is compared to a nominal work.

Moreover, U.S. Pat. No. 5,937,505 A, discloses a method of monitoring a crimping process, wherein a force stroke progression occurring during crimping is measured and checked whether it is within a reference region. Statistical theory is utilized to develop a continuous band of allowable variation in the progression.

Furthermore, EP 0 460 441 B1 discloses a method of monitoring a crimping process, wherein a force stroke progression occurring during crimping is measured. A group of data element pairs is selected from said progression in an interesting region. This group of data element pairs is analyzed and compared to a standard group of pairs taken during a known high quality crimp cycle to determine the quality of the present crimped connection.

Finally, EP 0 730 326 A2 discloses a method of evaluating a crimped electrical connection, which measures the crimping force over a range of positions of the crimping apparatus ram and derives a statistical envelope of acceptable forces. Each crimp is measured and the force measurements are compared against that envelope to determine the acceptability of the crimp. Acceptable crimps are then further evaluated to determine whether their data should be added to the data base.

However, despite all measures, which have been taken to make the decision whether a crimp connection is qualified a good (passed) or bad (failed) "fuzzy", meaning allowing some variation of the crimps, there is still room for improvement.

SUMMARY OF THE INVENTION

Thus, the invention provides an improved method of monitoring a crimping process, an improved crimping press, and an improved computer program product, in particular to reduce the need for manual intervention during crimping.

This is achieved by a method of monitoring a crimping process of the kind disclosed in the first paragraph, additionally comprising the steps of:

determining whether said actual force stroke progression/force time progression is a) above or b) below said ideal force stroke progression/force time progression in at least one point and shifting the upper border and/or the lower border upwards in case a) and downwards in case b), wherein there are an absolute upper limit, at which an upward shifting of the upper border is inhibited, and an absolute lower limit, at which a downward shifting of the lower border is inhibited.

Furthermore, the invention enables a crimping press for manufacturing crimp connections of the kind disclosed in the first paragraph, additionally comprising:

apparatus and procedures for determination of whether said actual force stroke progression/force time progression is a) above or b) below said ideal force stroke progression/force time progression in at least one point, and, apparatus and procedures for shifting the upper border and/or the lower border upwards in case a) and downwards in case b), wherein there are an absolute upper limit, at which an upward shifting of the upper border is inhibited, and an absolute lower limit, at which a downward shifting of the lower border is inhibited.

The invention also provides a computer program product, which when loaded into the memory of a control for a crimping press performs the procedures and functions of the inventive method.

By means of these features, the tolerance band for passed crimps is adapted to changing conditions. There may be slight variants of the wire and/or the crimps (e.g. thickness of material, material characteristics, etc.), changing temperature, drifts of the force sensor and/or stroke sensor, etc. According to prior art, an operator has to monitor these changes, directly or indirectly, via their influence on the crimp connection, and to take measures accordingly. This involves a lot of (ongoing) adjustments which can get cumbersome if, for example, an operator of a crimping press has to counteract the rising temperature in the morning, day by day. The present method enables the crimping press respectively its control to adapt themselves to changing conditions. If, for example, a series of crimps have their respective force stroke progressions or force time progressions systematically above an ideal force stroke progression or force time progression, the upper border and/or lower border are shifted upwards. Thus, crimp connections, whose force stroke progression or force time progression is below the new upper border but above an older upper border, are still considered as passed. In this way, the need for manual intervention may be significantly reduced.

Furthermore, there is an absolute upper limit, at which a further upward shifting of the upper border is inhibited, and also an absolute lower limit, at which a further downward shifting of the lower border is inhibited. Apart from dynamically shifting a tolerance band, it is useful for an operator to set absolute limits, beyond which the borders of the tolerance band may not move. Otherwise, it could happen that—as it is the case in EP 0 730 326 A2—a series of bad crimps cause the tolerance band to be shifted far away from that crimp (i.e., its force stroke progression or force time progression) considered to be ideal. In such circumstance, crimps, that are qualified as bad in the beginning of the adaptive algorithm, may be undesirably qualified as good at some point in time because of the drifting of the tolerance band. However, one will easily appreciate that said behavior is undesirable, as crimps could get worse and worse without any alert.

The method may be performed for just one point of the force progression or for a plurality of points. Of course it is beneficial for the overview to check points spread over the complete force progression. However, to save computing power, it is advantageous to perform the method above a particular threshold value of the force and to focus to a region in which the actual crimping takes place.

Initially, the ideal force progression can be determined during a so-called "teach-in process". Here, the force progressions of several crimps are stored, and if the operator of the crimping press considers the crimps to be good (e.g. based on the height or width of the crimp, electrical characteristics, visual inspection, grinding pattern, etc.), the stored progressions are used to generate an ideal force progression. This can be done based on the least mean square method, for example.

The elements of the crimping press, include elements for determination whether an actual force stroke progression/force time progression occurring during crimping is within a tolerance band, apparatus and procedures for qualifying a crimp as passed or failed, apparatus and procedures for determination of whether said actual force-stroke progression/force-time progression is a) above, or, b) below said ideal force-stroke progression/force-time progression, and apparatus and procedures for shifting the upper border and/or the lower border upwards in case a) and downwards in case b), that may be embodied in software or hardware or combinations thereof. Furthermore, these elements may be part of a (separate) control for the crimping press. In a preferred version, the apparatus and procedures are at least partially embodied in software and are in the form of software functions or software routines which may be programmed in any suitable programming language and are stored in a memory of a crimping press control. As is known per se, code is loaded into a central processing unit of the crimping press respectively its control for execution.

Advantageous versions of the invention are disclosed in the written content and the figures of this application.

It is advantageous if there are a first zone above and a second zone below said ideal progression and that the upper border and/or the lower border is shifted upwards if the actual progression is within said first zone, and the upper border and/or the lower border is shifted downwards if the actual progression is within said second zone.

Adaptation of the crimping process can take place by means of zones, which control the shift of the tolerance band, i.e. the upper and lower border. In this context it is beneficial, if the first zone and the second zone are spaced from the ideal progression. In this way, the algorithm can be made "slow". That means that not each and every deviation from an ideal crimp causes a shift of the tolerance band. Hence, a kind of hysteresis is employed.

Furthermore, it is beneficial in this context if the first zone and the second zone are adjacent to the ideal progression. In this way, the algorithm can be made "fast". It is very unlikely, that a crimp is absolutely identical to an ideal crimp. So, probably many crimps will cause a shift of the tolerance band.

Moreover, it is beneficial in this context if the upper border is spaced from the first zone and the lower border is spaced from the second zone. In this way, the algorithm can be made slow again, as crimps, whose force stroke progression or force time progression is far away from the ideal progression, do not influence the adaptation of the tolerance band.

Finally, it is beneficial in this context if the upper border is adjacent to the first zone and the lower border is adjacent to the second zone. In this way, the algorithm can be made fast again, as crimps, whose force stroke progression or force time progression is far away from the ideal progression, influence the adaptation of the tolerance band.

In another advantageous embodiment of the invention, there are a first zone near above, a second zone near below, a third zone far above, and a fourth zone far below said ideal progression, and:

the lower border is shifted upwards if the actual progression is within said first zone, the upper border is shifted downwards if the actual progression is within said second zone, the upper border is shifted upwards if the actual progression is within said third zone, and the lower border is shifted downwards if the actual progression is within said fourth zone.

The inventors have found that such a configuration is of particular advantage as the borders move "smoothly", meaning not too fast and not too slow. In this way, a particular crimp quality can be ensured over a long period of time and/or a broad range of disturbing influences.

In this context it is beneficial, if the first zone is adjacent to said ideal progression, the third zone is adjacent to the first zone, the second zone is adjacent to said ideal progression, and the fourth zone is adjacent to the second zone. This algorithm is a fast one as many crimps cause a change of the tolerance band. In variants, the upper border may be either adjacent to or spaced from the third zone, and the lower border may be either adjacent to or spaced from the fourth zone.

Furthermore, it is beneficial in this context if the first zone is adjacent to said ideal progression, the third zone is spaced from the first zone, the second zone is adjacent to said ideal progression, and the fourth zone is spaced from the second zone. This algorithm is a slower one as few crimps cause a change of the tolerance band. It is suitable for crimping presses very well. In variants, the upper border may be either adjacent to or spaced from the third zone, and the lower border may be either adjacent to or spaced from the fourth zone.

With reference to the immediately preceding two paragraphs, and in the context of what was earlier explained, it may be understood that in some versions advantages may be obtained if the first zone and the second zone are spaced from the ideal progression. As previously explained, in this way, the algorithm can be made "slow". That means that not each and every deviation from an ideal crimp and near to the ideal progression, causes a shift of the tolerance band. Here again, a kind of hysteresis, or absence in control response is utilized.

Moreover, it is beneficial in this context, in some versions, if the upper border is spaced from the third zone and the lower border is spaced from the fourth zone. Again, similarly to what was previously explained, the algorithm can be made slow in this manner, as "outlying" crimps, whose force stroke-progression or force-time progression lies far away from the ideal progression, but still within the tolerance band upper and lower borders, do not influence the adaptation of the tolerance band. This algorithm is suitable for crimping presses very well, too. In the context of the explanation given in the immediately preceding paragraph, it may be understood that the greatest amount of slowing would be provided by the version in which not only is the upper border spaced from the third zone and the lower border is spaced from the fourth zone, but additionally the first zone and the second zone are spaced from the ideal progression.

Finally, it is beneficial in this context if the probability that a crimp is within any one of the first to fourth zone is substantially equal for all zones. In this way, convergence of the upper border and lower border towards the standard derivation 3*a* after the inventive method has been performed often enough (e.g. 1000 times) can be achieved.

In yet another advantageous version of the invention, instead of or in addition to the force a physical variable derived from the force is used for the method. In addition or alternatively to the force also, for example, the crimping work may be the foundation for the method. Furthermore, the first derivative of the force may be said foundation.

Finally, it is advantageous if the mean value of the tolerance band is set as the ideal force progression after a predetermined number of cycles of the inventive method. According to this embodiment, not only the tolerance band changes but also the ideal force progression, i.e. the perception of what is an ideal crimp connection. Thus, changing influences on the crimping process can be handled even better.

It should be noted at this stage that the versions and variants of the invention as well as the associated advantages discussed for the inventive method are equally applicable to the inventive crimping press and the inventive computer program product.

The versions disclosed hereinbefore may be combined in any desired way.

BRIEF DESCRIPTION OF THE DRAWINGS

The present invention is discussed hereinafter by means of schematic figures and drawings, which help illustrate the invention. These figures, drawings and embodiments are not, however, intended to limit the broad scope of the invention. The Figures show.

DETAILED DESCRIPTION

In the following description and appended claims, the term "force progression" shall be used to mean both force-stroke progression and force-time progression unless specifically indicated otherwise.

Figure 1:
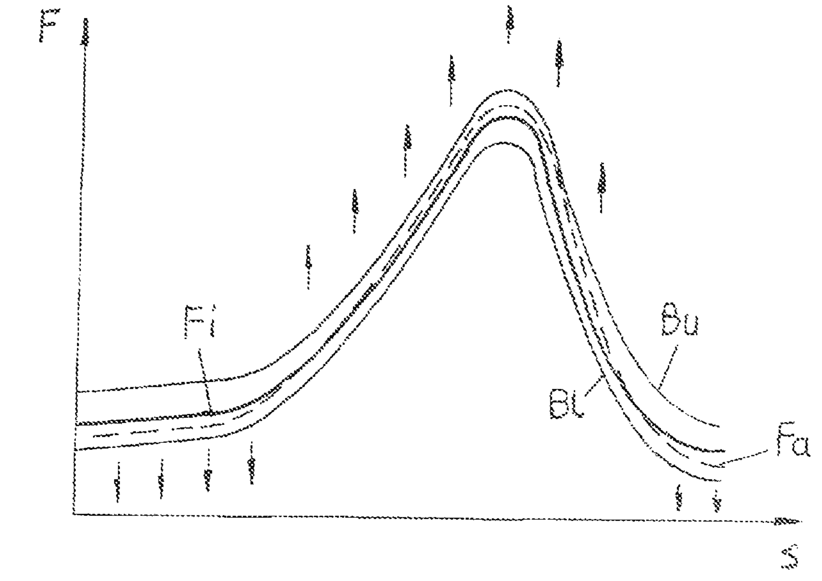
FIG. 1 an ideal force stroke progression vs. an actual force stroke progression and a tolerance band.

FIG. 1 schematically shows an ideal force stroke progression (that means an ideal force stroke diagram or graph of an ideal crimp) Fi, an actual force stroke progression (that means an actual force stroke diagram or graph currently occurring crimping) Fa in dashed lines, an upper border Bu of a tolerance band and a lower border Bl of the tolerance band. Crimps having a force stroke graph Fa within the tolerance band are qualified as passed in this example. As can be seen, the actual force stroke progression Fa is below the ideal progression Fi in a first part of the diagram, above it in a second part of the diagram and again below it in a third part of the diagram. Arrows indicate whereto the tolerance band, respectively its borders Bu and Bl move, respectively as shifted.

One skilled in the art will easily appreciate that the teachings disclosed hereinbefore and hereinafter are equally applicable to force-time progressions though just force-stroke progressions are depicted for simplicity in the Figures.

Figure 2:
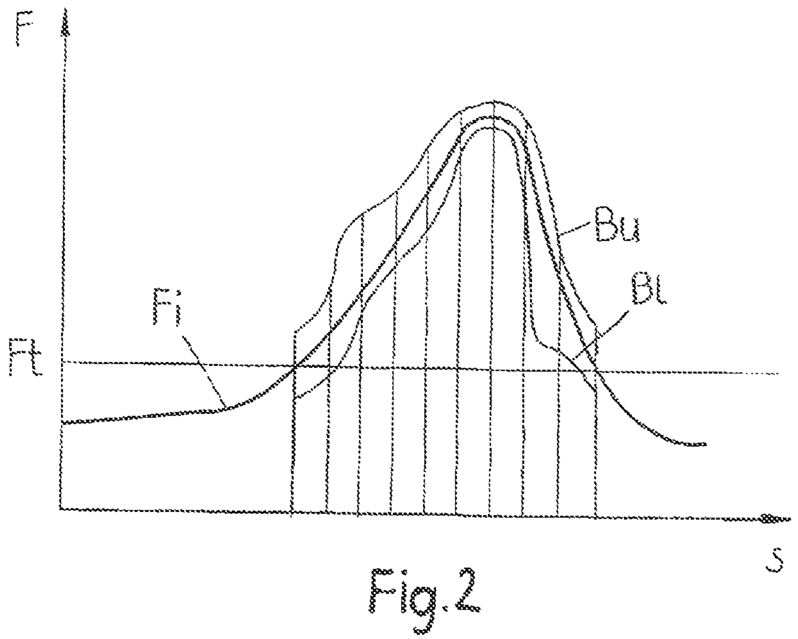
FIG. 2 the ideal progression and a tolerance band after several cycles of the inventive method.

FIG. 2 shows the ideal force progression Fi of FIG. 1 and a tolerance band after several cycles of the inventive method. One can see that the tolerance band has several dents, which are caused by crimps deviating from the ideal crimp. One can also see that the width of the band is not constant but may increase and decrease during the course of time. Furthermore, the inventive method is executed only above a particular threshold force Ft in this embodiment. Thus, the evaluation is focused to a region of interest as here the crimping actually takes place. In addition, points are depicted, at which the inventive method is executed. However, instead of points, regions or ranges in which the method is executed, are also contemplated.

FIGS. 3*a* to 3*d* and 4*a* to 4*e* show details of force-stroke progressions of the kind shown in the FIGS. 1 and 2, i.e., particular points or regions/ranges, at which the inventive method is executed.

Figures 3A, 3B, 3C, 3D:
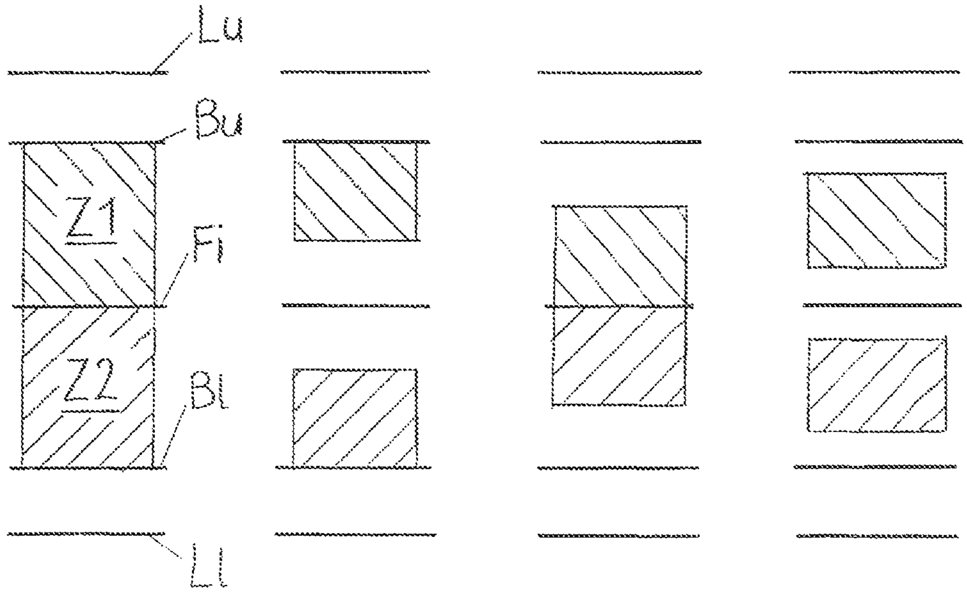
FIG. 3*a* a version with two zones for controlling the shift of the tolerance band.
FIG. 3*b* similar to FIG. 3*a* but with the zones being spaced from the ideal force progression.
FIG. 3*c* similar to FIG. 3*a* but with the zones being spaced from the upper and lower border.
FIG. 3*d* similar to FIG. 3*a* but with the zones being spaced from the ideal force progression and the upper and lower border.

FIG. 3*a* shows a first version, wherein a first zone Z1 and a second zone Z2 are used to control the shifting of the upper border Bu or the lower border Bl. If the actual progression Fa is within said first zone Z1, the upper border Bu and/or the lower border Bl is shifted upwards. If the actual progression Fa is within said second zone Z2, the upper border Bu and/or the lower border Bl is shifted downwards. FIG. 3*a* shows that the first and the second zones Z1 and Z2, respectively, are adjacent to the ideal force progression Fi and the upper border Bu respectively, and the lower border Bl respectively. In addition, an absolute upper limit Lu, at which an upward shifting of the upper border Bu is inhibited, and an absolute lower limit Ll, at which a downward shifting of the lower border Bl is inhibited, is shown in FIG. 3*a*. This algorithm is rather fast, as every crimp that qualifies as "passed" and which is not "totally" ideal by chance, causes a shift of the upper border Bu and/or the lower border Bl.

FIG. 3*b* is quite similar to FIG. 3*a*. The only difference is that the first and the second zones Z1 and Z2 are spaced from the ideal force progression Fi. This causes the algorithm to respond a bit slower as crimps that are almost ideal (near Fi, between Z1 and Z2), do not cause a shift of the upper border Bu and/or the lower border Bl.

FIG. 3*c* shows another version similar to that shown in FIG. 3*a*. Here the first zone Z1 is spaced from the upper border Bu and the second zone Z2 is spaced from the lower border Bl. Again, this causes the algorithm to respond a bit slower as passable crimps that are farther away from being ideal do not cause a shift of the upper border Bu and/or the lower border Bl.

FIG. 3*d* finally shows a last version utilizing first Z1 and second Z2 zones, similar to that shown in FIG. 3*a*. Here the first and the second zone Z1 and Z2 are spaced both from the ideal force progression Fi as well as from the upper border Bu, respectively, and the lower border Bl, respectively. This version is rather slow, but also rather stable.

Figure 4A:
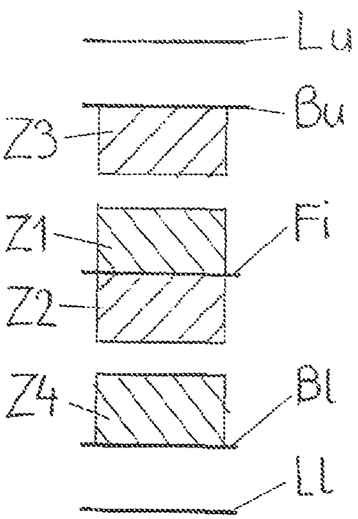
FIG. 4*a* a version with four zones for controlling the shift of the tolerance band, where third zone is spaced separated above said first zone and fourth zone is spaced separated below said second zone.

FIG. 4*a* depicts yet another version. A first zone Z1 is arranged near above, a second zone Z2 near below, a third zone Z3 farther above, and a fourth zone Z4 farther below relative to ideal force progression Fi. If the actual progression Fa is within said first zone Z1, the lower border Bl is shifted upwards. If the actual progression Fa is within said second zone Z2, the upper border Bu is shifted downwards. If the actual progression Fa is within said third zone Z3, the upper border Bu is shifted upwards, and if the actual progression is within said fourth zone Z4 the lower border Bl is shifted downwards. This version performs particularly smooth changes and is very well suitable for crimping presses.

According to this version, the first zone Z1 is adjacent to and above said ideal progression Fi, the third zone Z3 is spaced separated above from the first zone Z1, the second zone Z2 is adjacent to and below said ideal progression Fi, and the fourth zone Z4 is spaced separated below from the second zone Z2. Furthermore, as depicted in FIG. 4*c*, the upper border Bu may be spaced from the third zone Z3 and the lower border Bl may be spaced from the fourth zone Z4. This variant is even better suitable for the crimping process.

Figure 4B:
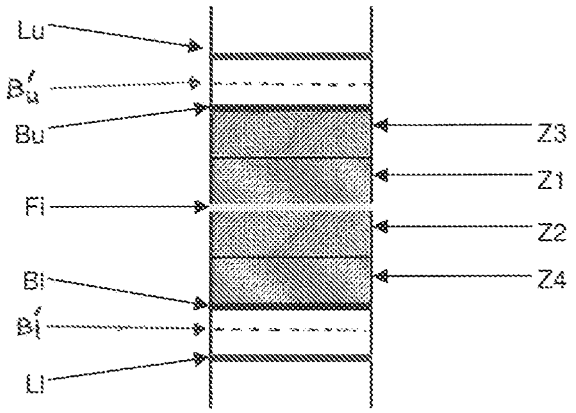
FIG. 4*b* another version with four zones for controlling the shift of the tolerance band, but where first zone is adjacent to third zone and second zone is adjacent to fourth zone.
Figure 4C:
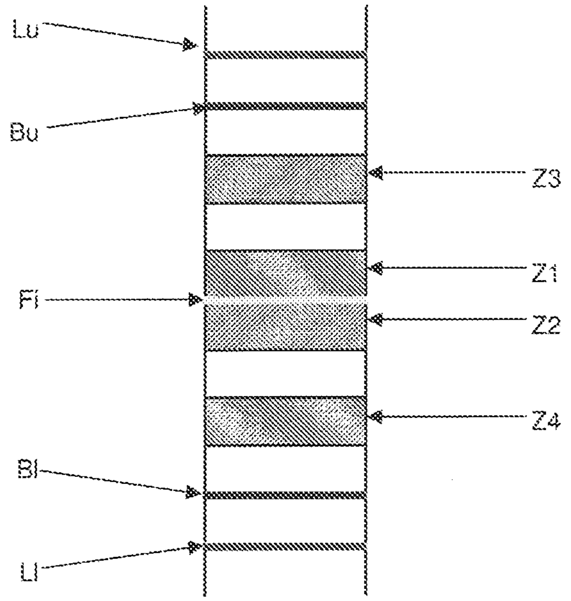
FIG. 4*c* another version with four zones for controlling the shift of the tolerance band, but where third zone is spaced separated above said first zone and fourth zone is spaced separated below said second zone, the third zone being spaced from the upper border, and the fourth zone being spaced from the lower border.

As further depicted in FIG. 4*b*, it may be advantageous, in other versions, if the first zone Z1 is adjacent to said ideal progression Fi, the third zone Z3 is adjacent to the first zone Z1, the second zone Z2 is adjacent to said ideal progression Fi, and the fourth zone Z4 is adjacent to the second zone Z2. This algorithm is a fast one as many crimps cause a change of the tolerance band. The upper border may be either adjacent to Bu or spaced from Bu' the third zone Z3, and the lower border may be either adjacent to Bl or spaced from Bl' the fourth zone Z4.

Figure 4D:
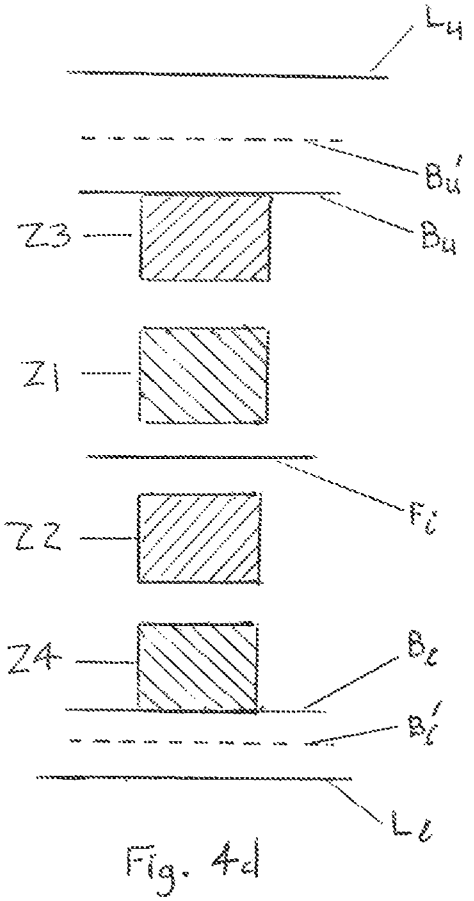
FIG. 4*d* versions with four zones for controlling the shift of the tolerance band, with both first and second zones being spaced from the ideal force progression, where third zone is spaced separated above said first zone and fourth zone is spaced separated below said second zone, third zone being either spaced from or adjacent to the upper border, and fourth zone being either spaced from or adjacent to the lower border.
Figure 4E:
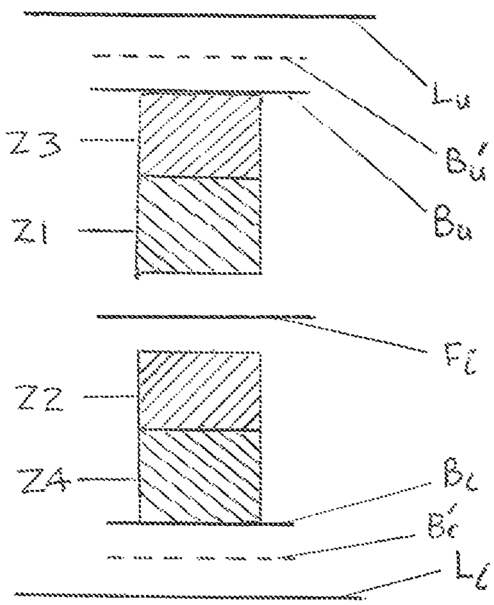
FIG. 4*e* a version with four zones for controlling the shift of the tolerance band, where first zone is adjacent to third zone and second zone is adjacent to fourth zone, but both first and second zones are spaced from the ideal force progression, third zone being either spaced from or adjacent to the upper border, and fourth zone being either spaced from or adjacent to the lower border.
Figure 5:
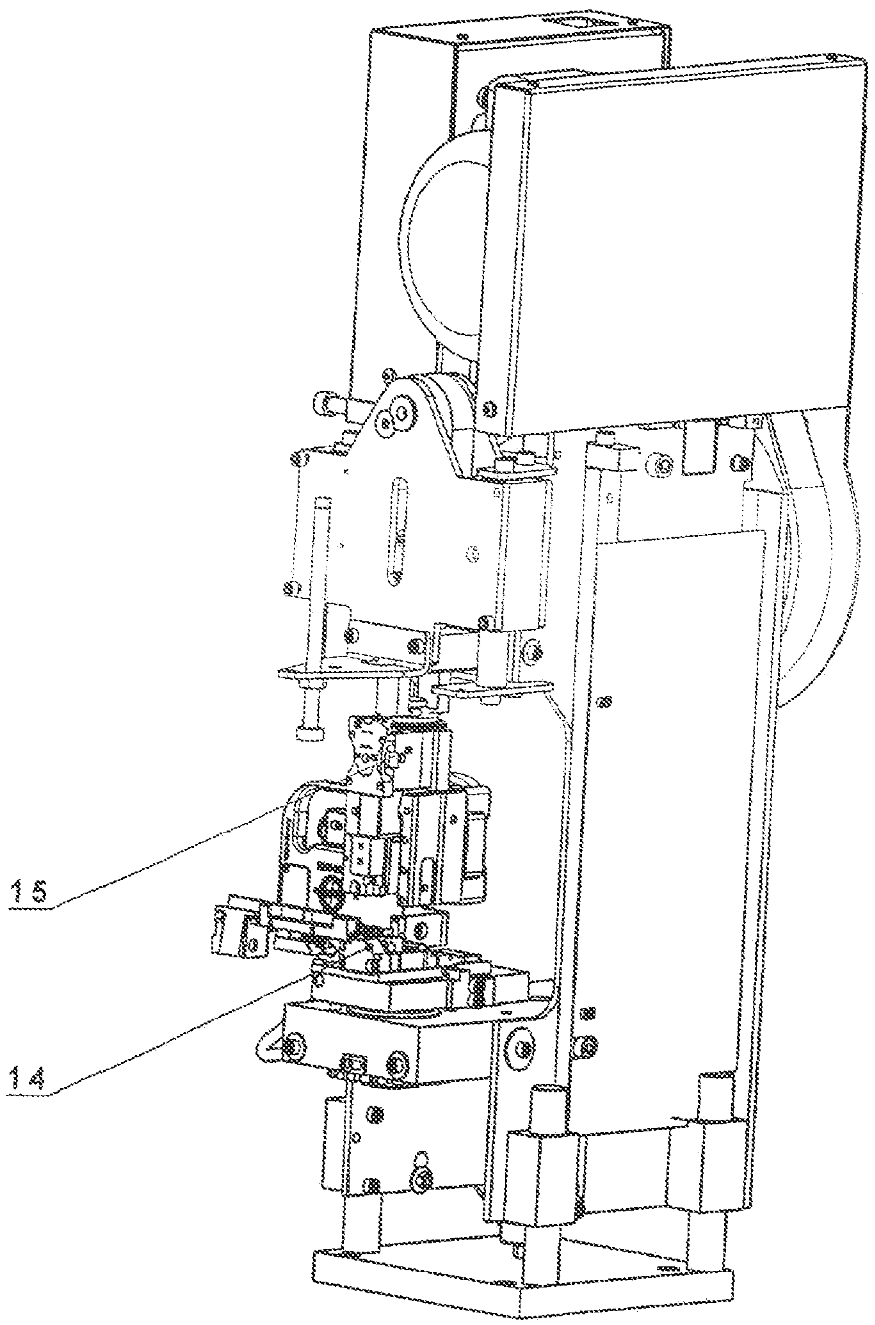
FIG. 5 a complete crimping press depicts 15 a plunger and 14 a die.

However, within the context of each of FIGS. 4*a*, 4*b*, 4*c* and the preceding description, it should be readily understood that it may be desirable in some versions to space both the first zone Z1 and the second zone Z2 from the ideal progression, generally in the manner previously depicted in FIGS. 3*b*, 3*d*. FIG. 4*d* depicts this generally, showing the third zone Z3 as spaced above separated from the first zone Z1, and the fourth zone Z4 as spaced separated from and below the second zone Z2, where, the upper border Bu' may be spaced from the third zone Z3 and the lower border Bl' may be spaced from the fourth zone Z4; or alternatively, the third and the fourth zones Z3 and Z4 respectively are adjacent to the upper border Bu respectively, and the lower border Bl respectively. FIG. 4*e* also depicts this generally, but where the third zone Z3 is adjacent to the first zone Z1 and the fourth zone Z4 is adjacent to the second zone Z2, similar to FIG. 4*b*, while the upper border Bu' may be spaced from the third zone Z3 and the lower border Bl' may be spaced from the fourth zone Z4; or alternatively, the third and the fourth zones Z3 and Z4 respectively are adjacent to the upper border Bu respectively, and the lower border Bl respectively.

In one practical implementation, the force stroke progression is separated into 1024 segments, and in each segment it is determined if the actual force is within one of the zones Z1-Z4. In this way, the crimping process can be monitored and controlled very accurately.

If the probability that a crimp is within any one of the first to fourth zone Z1-Z4 is substantially equal for all zones Z1-Z4, convergence of the upper border Bu and lower border Bl towards the standard derivation 3*a* can be achieved. Hence 99.73% of all crimps are considered as passed.

Generally the ratio between the first and the fourth zone Z1 and Z4 defines the limiting value of the lower border Bl and the ratio between the second and the third zone Z2 and Z3 defines the limiting value of the upper border Bu. One skilled in the art will easily appreciate that the upper and lower border Bu and Bl do not necessarily have to have the same distance to the ideal force progression Fi, but may be set independently by different ratios between the zones Z1-Z4. While the ratio defines the limiting value, the sizes of the zones Z1-Z4 define the convergence speed. The bigger the zones Z1-Z4 are, the faster the algorithm is as the probability that a crimp connection falls within a zone Z1-Z4 is increased. In an advantageous embodiment the outer zones, i.e. the third and the fourth zone Z3 and Z4 have a width of 1/18 of the distance between the ideal force progression Fi and the borders Bu and Bl.

Note that although the zones Z1-Z4 have the same width, the probability that a crimp is within any one of the first to fourth zone Z1-Z4 is not equal. By contrast, the probability for the first and the second zone Z1, Z2 is higher as the Gaussian distribution is higher in the center region. Accordingly, the first and the second zones Z1 and Z2 have to be smaller than the third and the fourth zones Z3 and Z4 if the probability for all zones Z1-Z4 is to be equal. Concretely, the area under the Gaussian distribution must be equal for all zones Z1-Z4 then.

In one real version of a crimp press of the applicant, the operator inputs the percentage of the desired passed (or failed) crimps. Then the control of the crimp press computes the ratio between the zones Z1-Z4 associated with said percentage and also determines an absolute size of the zones Z1-Z4 depending on a desired convergence speed. In many cases setting a percentage of passed crimps to 99.73% (standard derivation 3*a*) and a width of the third and the fourth zone Z1-Z4 to 1/18 of the distance between the ideal force progression and the borders Bu and Bl will lead to satisfying results.

One skilled in the art will easy perceive that the inventive methodologies as depicted in the drawings are equally applicable to physical values derived from the force F as, for example, crimping work or first derivative of the force.

In a particular advantageous version, the mean value of the tolerance band gets the ideal force progression Fi after a predetermined number of cycles of the inventive method. For example, this change may take place every 50 crimps. In this way, the zones Z1-Z4 may be adapted to a "new" ideal crimp that in turn influences the inventive algorithm. The presettable absolute upper and lower limits Lu and Lo may change as well, or may remain unchanged. The first alternative, however, involves the risk that the process "drifts away" as by itself it can change its limitations. All in all, it is more useful to keep the absolute upper and lower limit Lu and Lo fixed in most cases.

The invention also encompasses a computer program product fixed on at least one tangible machine-readable medium, which when loaded into the memory of a control for a crimping press performs the procedures and functions of the method as explained above, and this may be readily understood via schematic depiction. Such machine-readable medium may include, but is not limited to, fixed (hard) drives, magnetic tape, floppy diskettes, optical disks, compact disc read-only memories (CD-ROMs), and magneto-optical disks, semiconductor memories, such as ROMs, PROMs, random access memories (RAMs), programmable read-only memories (PROMs), erasable PROMs (EPROMs), electrically erasable PROMs (EEPROMs), flash memory, magnetic or optical cards, or other type of media/machine-readable medium suitable for storing electronic instructions (e.g., computer programming code, such as software or firmware). Moreover, embodiments of the present invention may also be downloaded as one or more computer program products, wherein the program may be transferred from a remote computer to a requesting computer by way of data signals embodied in a carrier wave or other propagation medium via a communication link (e.g., a modem or network connection).

Finally, it should be noted that the above-mentioned explanations illustrate, in an exemplary manner, rather than limit, the invention, and that those skilled in the art will be capable of designing many alternative embodiments without departing from the scope of the invention as defined by the appended claims. The scope of the present invention is defined by the appended claims, including known equivalents and unforeseeable equivalents at the time of filing of this application. In the claims, any reference signs placed in parentheses shall not be construed as limiting the claims. The verb 'comprise' and its conjugations do not exclude the presence of elements or steps other than those listed in any claim or the specification as a whole. The singular reference of an element does not exclude the plural reference of such elements and vice-versa. In a device claim enumerating several elements or steps, more than one of these means, elements or steps may be embodied by one and the same item of software or hardware. The mere fact that certain measures are recited in mutually different dependent claims does not indicate that a combination of these measures cannot be used to advantage within the protected scope of the invention.

LIST OF REFERENCE LABELS

Bl, Bl' lower border
Bu, Bu' upper border
F force
Fa actual force progression
Fi ideal force progression
Ft threshold force
Ll absolute lower limit
Lu absolute upper limit
s stroke
Z1-Z4 first to fourth zone
14 die
15 plunger

What is claimed is:

1. A method of monitoring a crimping process, comprising:
- generating an ideal crimping force progression level;
- setting a tolerance band of actual force progression level surrounding the ideal force progression level;
- providing the tolerance band with an upper border of actual force progression level above the ideal force progression level;
- setting a first zone of actual crimping force progression level above the ideal force progression;
- setting a first lower bound of actual force progression level as a lower bound for the first zone;
- setting the level of the first lower bound of actual force progression level higher than the ideal force progression;
- setting a first upper bound of actual force progression as an upper bound for the first zone;
- setting the level of the first upper bound of actual force progression level higher than the first lower bound;
- setting a third zone of actual crimping force progression level above the first zone and below the upper border;
- setting a third lower bound of actual force progression level as a lower bound for the third zone;
- setting a third upper bound of actual force progression level as an upper bound for the third zone;
- defining a fixed upper limit of actual crimping force progression level above the upper border;

providing the tolerance band with a lower border of actual force progression level below the ideal force progression level;

setting a second zone of actual crimping force progression level below the ideal force progression;

setting a second upper bound of actual force progression level as an upper bound for the second zone;

setting the level of the second upper bound of actual force progression level lower than the ideal force progression;

setting a second lower bound of actual force progression as a lower bound for the second zone;

setting the level of the second lower bound of actual force progression level lower than the second upper bound;

setting a fourth zone of actual crimping force progression level below the second zone and above the lower border;

setting a fourth upper bound of actual force progression level as an upper bound for the fourth zone;

setting a fourth lower bound of actual force progression level as a lower bound for the fourth zone;

defining a fixed lower limit of actual crimping force progression level below the lower border;

measuring the actual force progression of a crimping operation;

making a determination of whether the measured actual force progression lies within the first zone or the second zone, or the third zone, or the fourth zone;

dynamically shifting the tolerance band defined by the upper tolerance border and lower tolerance border based on the determination; and, limiting the dynamic shifting of the tolerance band to within the fixed upper limit and the fixed lower limit.

2. A method of monitoring a crimping process as claimed in claim 1, further comprising:

shifting the upper border to a lower level of force progression when the determination indicates the second zone.

3. A method of monitoring a crimping process as claimed in claim 1, further comprising:

shifting the upper border to a higher level of force progression when the determination indicates the third zone.

4. A method of monitoring a crimping process as claimed in claim 1, further comprising:

shifting the lower border to a higher level of force progression when the determination indicates the first zone.

5. A method of monitoring a crimping process as claimed in claim 1, further comprising:

shifting the lower border to a lower level of force progression when the determination indicates the fourth zone.

6. A method of monitoring a crimping process as claimed in claim 1, further comprising one of the steps of:

setting the upper border of force progression level higher than the third upper bound for the third zone; or alternatively, setting the upper border of force progression level coincident with the third upper bound for the third zone.

7. A method of monitoring a crimping process as claimed in claim 1, further comprising one of the steps of:

setting the lower border of force progression level lower than the fourth lower bound for the fourth zone; or alternatively, setting the lower border of force progression level coincident with the fourth lower bound for the fourth zone.

8. A method of monitoring a crimping process as claimed in claim 1, further comprising one of the steps of:

setting the first upper bound for the first zone coincident with the third lower bound of the third zone; or alternatively, setting the third lower bound of the third zone higher than the first upper bound for the first zone.

9. A method of monitoring a crimping process as claimed in claim 1, further comprising one of the steps of:

setting the second lower bound for the second zone coincident with the fourth upper bound of the fourth zone; or alternatively, setting the fourth upper bound of the fourth zone lower than the second lower bound for the second zone.

10. A method of monitoring a crimping process, comprising:

generating an ideal crimping force progression level;

setting a tolerance band of actual force progression level surrounding the ideal force progression level;

providing the tolerance band with an upper border of actual force progression level above the ideal force progression level;

setting a first zone of actual crimping force progression level above the ideal force progression;

setting a first lower bound of actual force progression level as a lower bound for the first zone;

setting the level of the first lower bound of actual force progression level coincident with the ideal force progression;

setting a first upper bound of actual force progression as an upper bound for the first zone;

setting the level of the first upper bound of actual force progression level higher than the first lower bound;

setting a third zone of actual crimping force progression level above the first zone and below the upper border;

setting a third lower bound of actual force progression level as a lower bound for the third zone;

setting the third lower bound for the third zone coincident with the first upper bound for the first zone;

setting a third upper bound of actual force progression level as an upper bound for the third zone;

defining a fixed upper limit of actual crimping force progression level above the upper border;

providing the tolerance band with a lower border of actual force progression level below the ideal force progression level;

setting a second zone of actual crimping force progression level below the ideal force progression;

setting a second upper bound of actual force progression level as an upper bound for the second zone;

setting the level of the second upper bound of actual force progression level coincident with the ideal force progression;

setting a second lower bound of actual force progression as a lower bound for the second zone;

setting the level of the second lower bound of actual force progression level lower than the second upper bound;

setting a fourth zone of actual crimping force progression level below the second zone and above the lower border;

setting a fourth upper bound of actual force progression level as an upper bound for the fourth zone;

setting the fourth upper bound for the fourth zone coincident with the second lower bound for the second zone;

setting a fourth lower bound of actual force progression level as a lower bound for the fourth zone;

defining a fixed lower limit of actual crimping force progression level below the lower border;

measuring the actual force progression of a crimping operation;

making a determination of whether the measured actual force progression lies within the first zone or the second zone, or the third zone, or the fourth zone;

dynamically shifting the tolerance band defined by the upper tolerance border and lower tolerance border based on the determination; and, limiting the dynamic shifting of the tolerance band to within the fixed upper limit and the fixed lower limit.

11. A method of monitoring a crimping process as claimed in claim 10, further comprising one of the steps of:

setting the upper border of force progression level higher than the third upper bound for the third zone; or alternatively, setting the upper border of force progression level coincident with the third upper bound for the third zone.

12. A method of monitoring a crimping process as claimed in claim 10, further comprising one of the steps of:

setting the lower border of force progression level lower than the fourth lower bound for the fourth zone; or alternatively, setting the lower border of force progression level coincident with the fourth lower bound for the fourth zone.

13. A method of monitoring a crimping process as claimed in claim 10, further comprising:

shifting the upper border to a lower level of force progression when the determination indicates the second zone.

14. A method of monitoring a crimping process as claimed in claim 10, further comprising:

shifting the upper border to a higher level of force progression when the determination indicates the third zone.

15. A method of monitoring a crimping process as claimed in claim 10, further comprising:

shifting the lower border to a higher level of force progression when the determination indicates the first zone.

16. A method of monitoring a crimping process as claimed in claim 10, further comprising:

shifting the lower border to a lower level of force progression when the determination indicates the fourth zone.

17. A method of monitoring a crimping process, comprising:

generating an ideal crimping force progression level;

setting a tolerance band of actual force progression level surrounding the ideal force progression level;

providing the tolerance band with an upper border of actual force progression level above the ideal force progression level;

setting a first zone of actual crimping force progression level above the ideal force progression;

setting a first lower bound of actual force progression level as a lower bound for the first zone;

setting the level of the first lower bound of actual force progression level coincident with the ideal force progression;

setting a first upper bound of actual force progression as an upper bound for the first zone;

setting the level of the first upper bound of actual force progression level higher than the first lower bound;

setting a third zone of actual crimping force progression level above the first zone and below the upper border;

setting a third lower bound of actual force progression level as a lower bound for the third zone;

setting the third lower bound for the third zone higher than the first upper bound for the first zone;

setting a third upper bound of actual force progression level as an upper bound for the third zone;

defining a fixed upper limit of actual crimping force progression level above the upper border;

providing the tolerance band with a lower border of actual force progression level below the ideal force progression level;

setting a second zone of actual crimping force progression level below the ideal force progression;

setting a second upper bound of actual force progression level as an upper bound for the second zone;

setting the level of the second upper bound of actual force progression level coincident with the ideal force progression;

setting a second lower bound of actual force progression as a lower bound for the second zone;

setting the level of the second lower bound of actual force progression level lower than the second upper bound;

setting a fourth zone of actual crimping force progression level below the second zone and above the lower border;

setting a fourth upper bound of actual force progression level as an upper bound for the fourth zone;

setting the fourth upper bound for the fourth zone lower than the second lower bound for the second zone;

setting a fourth lower bound of actual force progression level as a lower bound for the fourth zone;

defining a fixed lower limit of actual crimping force progression level below the lower border;

measuring the actual force progression of a crimping operation;

making a determination of whether the measured actual force progression lies within the first zone or the second zone, or the third zone, or the fourth zone;

dynamically shifting the tolerance band defined by the upper tolerance border and lower tolerance border based on the determination; and, limiting the dynamic shifting of the tolerance band to within the fixed upper limit and the fixed lower limit.

18. A method of monitoring a crimping process as claimed in claim 17, further comprising one of the steps of:

setting the upper border of force progression level higher than the third upper bound for the third zone; or alternatively, setting the upper border of force progression level coincident with the third upper bound for the third zone.

19. A method of monitoring a crimping process as claimed in claim 17, further comprising one of the steps of:

setting the lower border of force progression level lower than the fourth lower bound for the fourth zone; or alternatively, setting the lower border of force progression level coincident with the fourth lower bound for the fourth zone.

20. A method of monitoring a crimping process as claimed in claim 17, further comprising:

shifting the upper border to a lower level of force progression when the determination indicates the second zone.

21. A method of monitoring a crimping process as claimed in claim 17, further comprising:

shifting the upper border to a higher level of force progression when the determination indicates the third zone.

22. A method of monitoring a crimping process as claimed in claim 17, further comprising:

shifting the lower border to a higher level of force progression when the determination indicates the first zone.

23. A method of monitoring a crimping process as claimed in claim 17, further comprising:

shifting the lower border to a lower level of force progression when the determination indicates the fourth zone.

* * * * *